(12) United States Patent
Miyakawa et al.

(10) Patent No.: US 8,116,112 B2
(45) Date of Patent: Feb. 14, 2012

(54) SEMICONDUCTOR MEMORY DEVICE

(75) Inventors: Tadashi Miyakawa, Yokohama (JP);
Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 32 days.

(21) Appl. No.: 12/553,048

(22) Filed: Sep. 2, 2009

(65) Prior Publication Data

US 2010/0054064 A1 Mar. 4, 2010

(30) Foreign Application Priority Data

Sep. 3, 2008 (JP) ................................. 2008-226417

(51) Int. Cl.
*G11C 5/06* (2006.01)

(52) U.S. Cl. ........................... 365/63; 365/206; 365/214

(58) Field of Classification Search ........................ None
See application file for complete search history.

(56) References Cited

U.S. PATENT DOCUMENTS

| | | | | |
|---|---|---|---|---|
| 6,898,102 B2 * | 5/2005 | Keeth | ............................. | 365/63 |
| 2002/0131312 A1 * | 9/2002 | Issa et al. | ..................... | 365/207 |
| 2004/0047172 A1 * | 3/2004 | Komatsuzaki | ................ | 365/145 |
| 2007/0104002 A1 * | 5/2007 | Edahiro | ........................ | 365/203 |
| 2008/0291762 A1 * | 11/2008 | Kajigaya | ....................... | 365/203 |

FOREIGN PATENT DOCUMENTS

| | | |
|---|---|---|
| JP | H08-287681 | 11/1996 |
| JP | 2008-084450 | 4/2008 |

OTHER PUBLICATIONS

Explanation of Non-English Language References.

* cited by examiner

*Primary Examiner* — Hoai V Ho
*Assistant Examiner* — Min Huang
(74) *Attorney, Agent, or Firm* — Knobbe, Martens, Olson & Bear, LLP

(57) ABSTRACT

A semiconductor memory apparatus includes: a bit line; a word line; a local bit line; a first switch unit provided between the local bit line and the bit; a memory cell connected to the bit line and the word line; a memory cell array including the memory cell; a first sense circuit connected to the bit line and configured to amplify a signal read out from the memory cell; and a second sense circuit connected to the local bit lines and configured to amplify a signal amplified by the first sense circuit, wherein the first switch unit disconnects the local bit line from the bit line when the first sense circuit amplifies the signal, and connects the local bit line to the bit line when the second sense circuit amplifies the signal amplified by the first sense circuit.

12 Claims, 13 Drawing Sheets

SEMICONDUCTOR MEMORY DEVICE

CROSS-REFERENCE TO RELATED APPLICATIONS

This application is based upon and claims the benefit of priority from Japanese Patent Application No. 2008-226417, filed Sep. 3, 2008, the entire contents of which are incorporated herein by reference.

BACKGROUND

1. Field

The present invention relates to a semiconductor memory device.

2. Description of the Related Art

Information that is stored in a memory cell of a semiconductor memory apparatus, such as a DRAM (Dynamic Random Access Memory), a FeRAM (Ferroelectric Random Access Memory), or the like, is read out from the memory cell at the time of a read-out operation and amplified by a latch-type sense amplifier circuit, and an amplified signal is output. A sense amplifier circuit, a precharge circuit, a column selection circuit, and the like are connected to the bit lines of the semiconductor memory apparatus (for example, see JP-A-8-287681).

In the read-out operation of the semiconductor memory apparatus described in JP-A-8-287681 or the like, a signal of a memory cell to be output to a bit line is determined by a ratio of capacitance of the memory cell and capacitance of the bit line. Parasitic capacitance of the memory cell, the sense amplifier circuit, the precharge circuit, the column selection circuit, and the like connected to the bit line may be regarded as bit line parasitic capacitance.

In recent years, with the development of miniaturization and high integration of a semiconductor device, the cell size of the memory cell is reduced, and cell capacitance becomes small. Meanwhile, with respect to bit line capacitance, even if the number of memory cells to be connected to the bit line decreases, parasitic capacitance of a circuit part, such as a sense amplifier circuit, a precharge circuit, a column selection circuit, and the like, remains as an offset. That is, while capacitance of the memory cell decreases due to miniaturization, it is difficult to decrease the bit line capacitance, as compared with capacitance of the memory cell. For this reason, with the development of miniaturization of the semiconductor device, the sense operation margin at the time of the read-out operation may be lowered. In addition, the sense speed at the time of the read-out operation may be lowered.

SUMMARY OF THE INVENTION

According to an aspect of the present invention, there is provided a semiconductor memory apparatus including: a bit line; a word line; a local bit line; a first switch unit provided between the local bit line and the bit line to control a connection between the local bit line and the bit line; a memory cell connected to the bit line and the word line; a memory cell array including the memory cell; a first sense circuit connected to the bit line and configured to amplify a signal read out from the memory cell; and a second sense circuit connected to the local bit lines and configured to amplify a signal amplified by the first sense circuit, wherein the first switch unit disconnects the local bit line from the bit line when the first sense circuit amplifies the signal, and connects the local bit line to the bit line when the second sense circuit amplifies the signal amplified by the first sense circuit.

According to another aspect of the present invention, there is provided a semiconductor memory apparatus including: a first bit line; a second bit line; a word line; a first local bit line; a second local bit line; a first switch unit provided between the first local bit line and the first bit line to control a connection between the first local bit line and the first bit line; a second switch unit provided between the second local bit line and the second bit line to control a connection between the second local bit line and the second bit line; a first memory cell connected to the first bit line and the word line; a second memory cell connected to the second bit line and the word line; a memory cell array including the first memory cell and the second memory cell; a first sense circuit connected to the first bit line and the second bit line and configured to amplify a signal read out from the first memory cell and the second memory cell; and a second sense circuit connected to the first local bit line and the second local bit line and configured to amplify a signal amplified by the first sense circuit, wherein the first switch unit is controlled by a first control signal, and the second switch unit is controlled by a second control signal that is different from the first control signal.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION

Hereinafter, embodiments of the invention will be described with reference to the drawings.

First Embodiment

Figure 1:
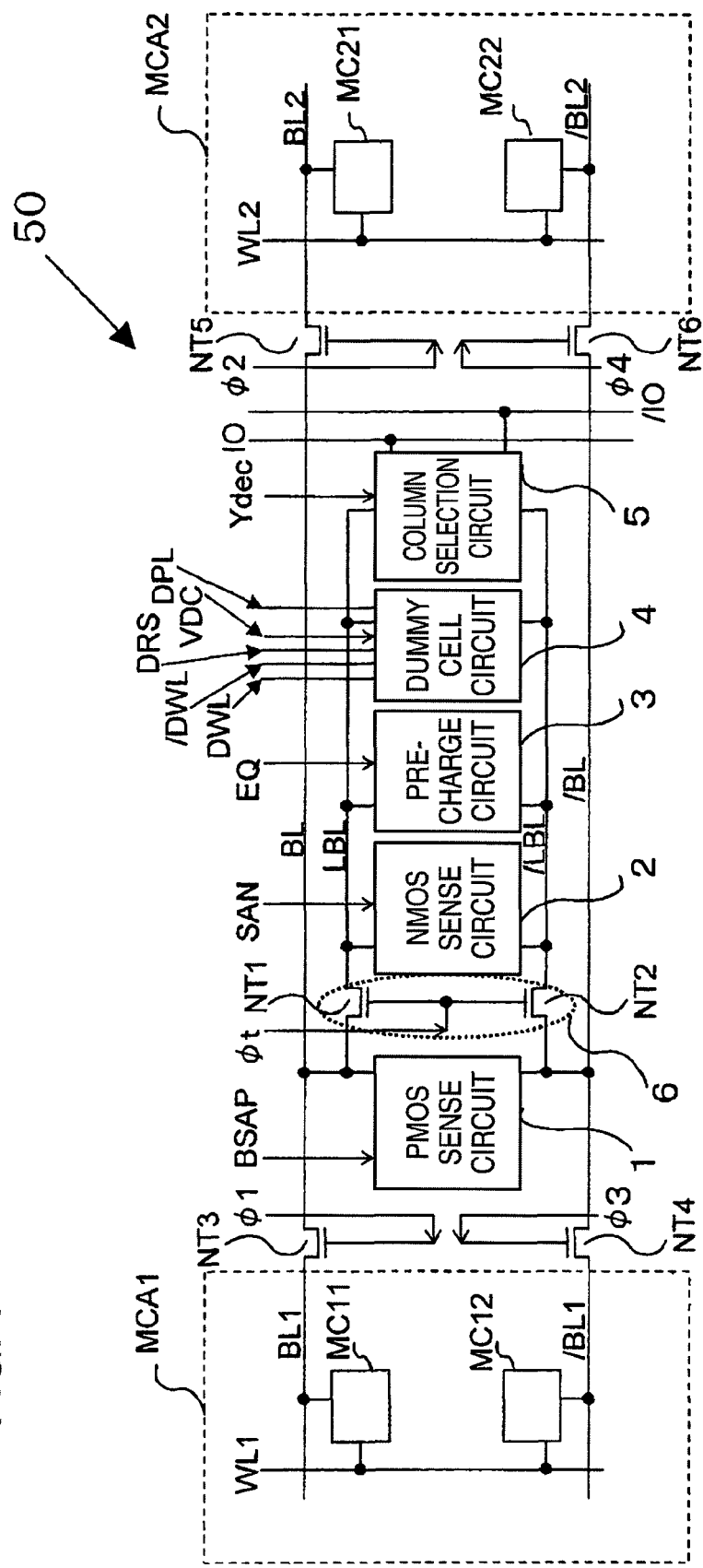
FIG. 1 is a circuit diagram showing a semiconductor memory apparatus according to a first embodiment of the invention.
Figure 2:
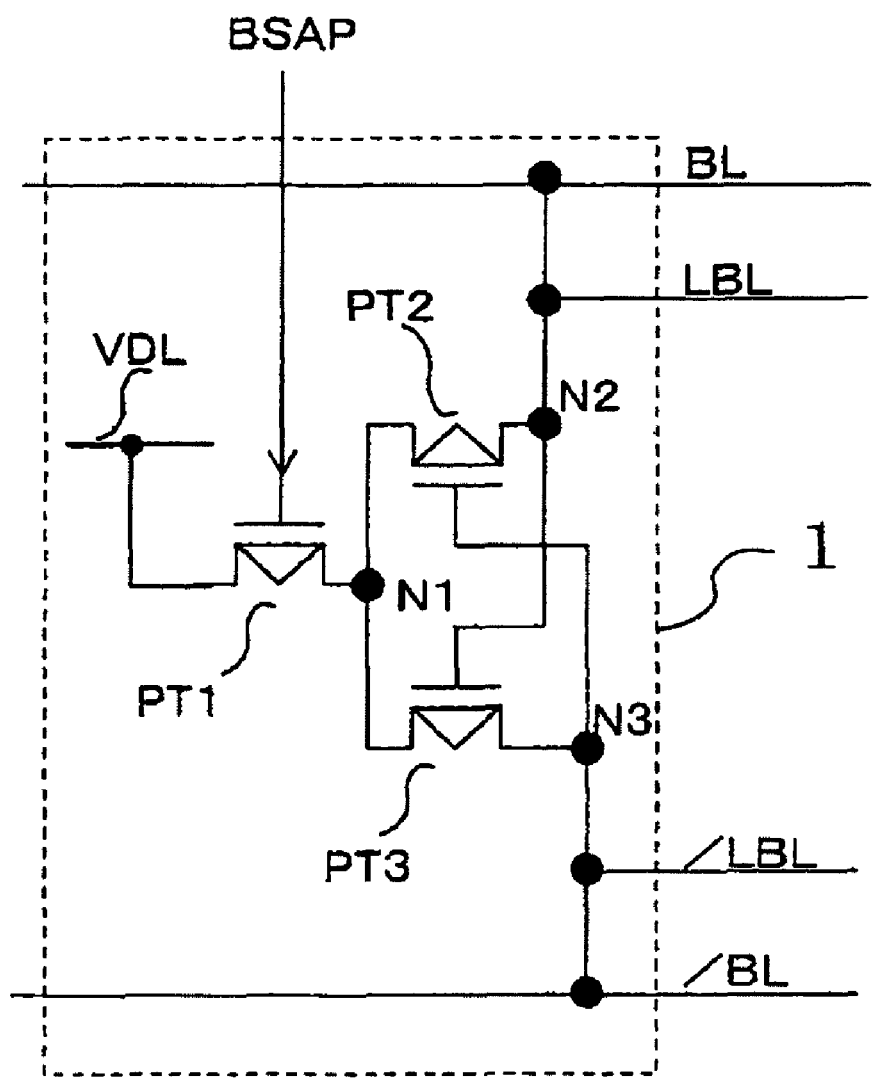
FIG. 2 is a circuit diagram showing a PMOS sense circuit according to the first embodiment.
Figure 3:
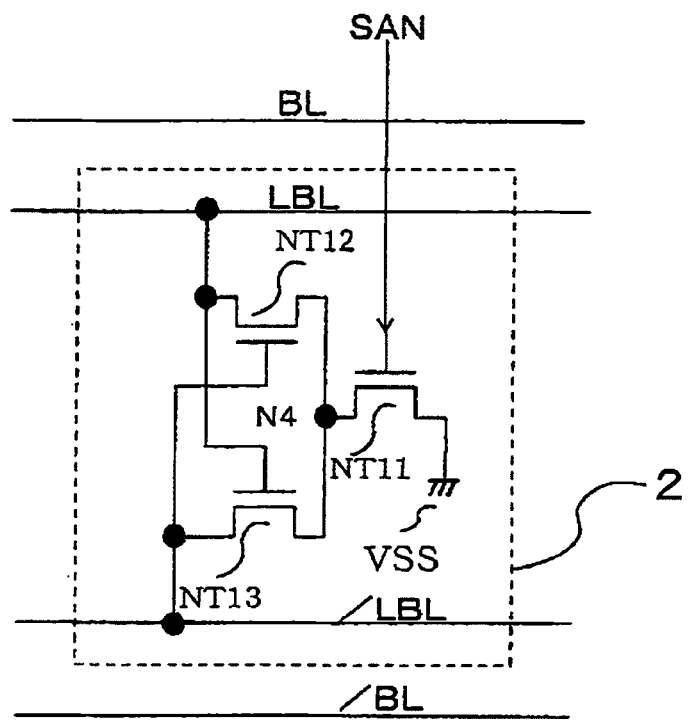
FIG. 3 is a circuit diagram showing an NMOS sense circuit according to the first embodiment.
Figure 4:
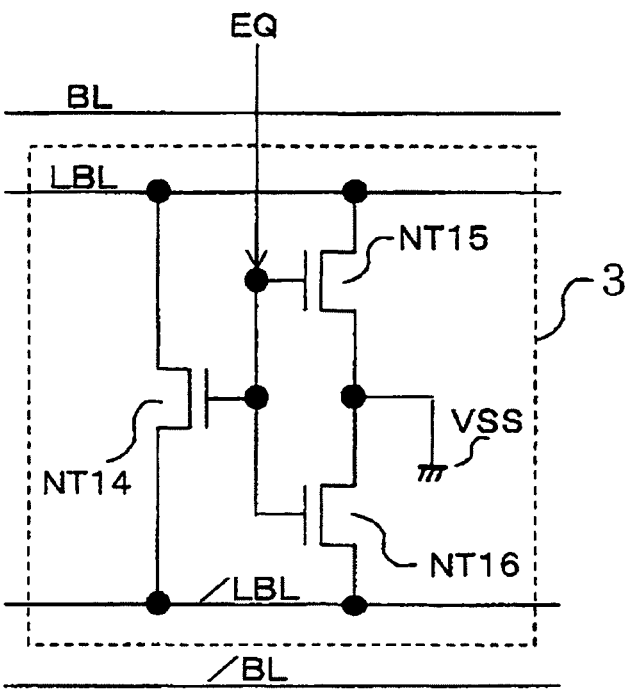
FIG. 4 is a circuit diagram showing a precharge circuit according to the first embodiment.
Figure 5:
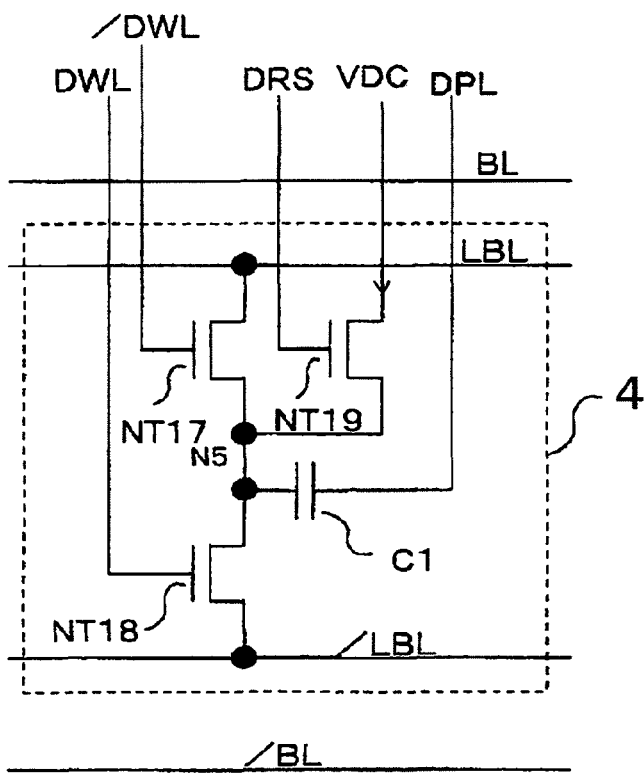
FIG. 5 is a circuit diagram showing a dummy cell circuit according to the first embodiment.
Figure 6:
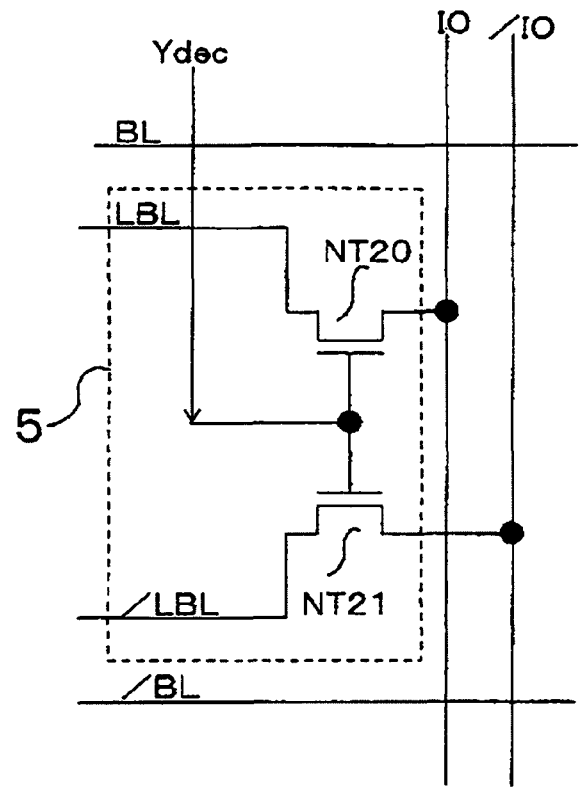
FIG. 6 is a circuit diagram showing a column selection circuit according to the first embodiment.
Figure 7:
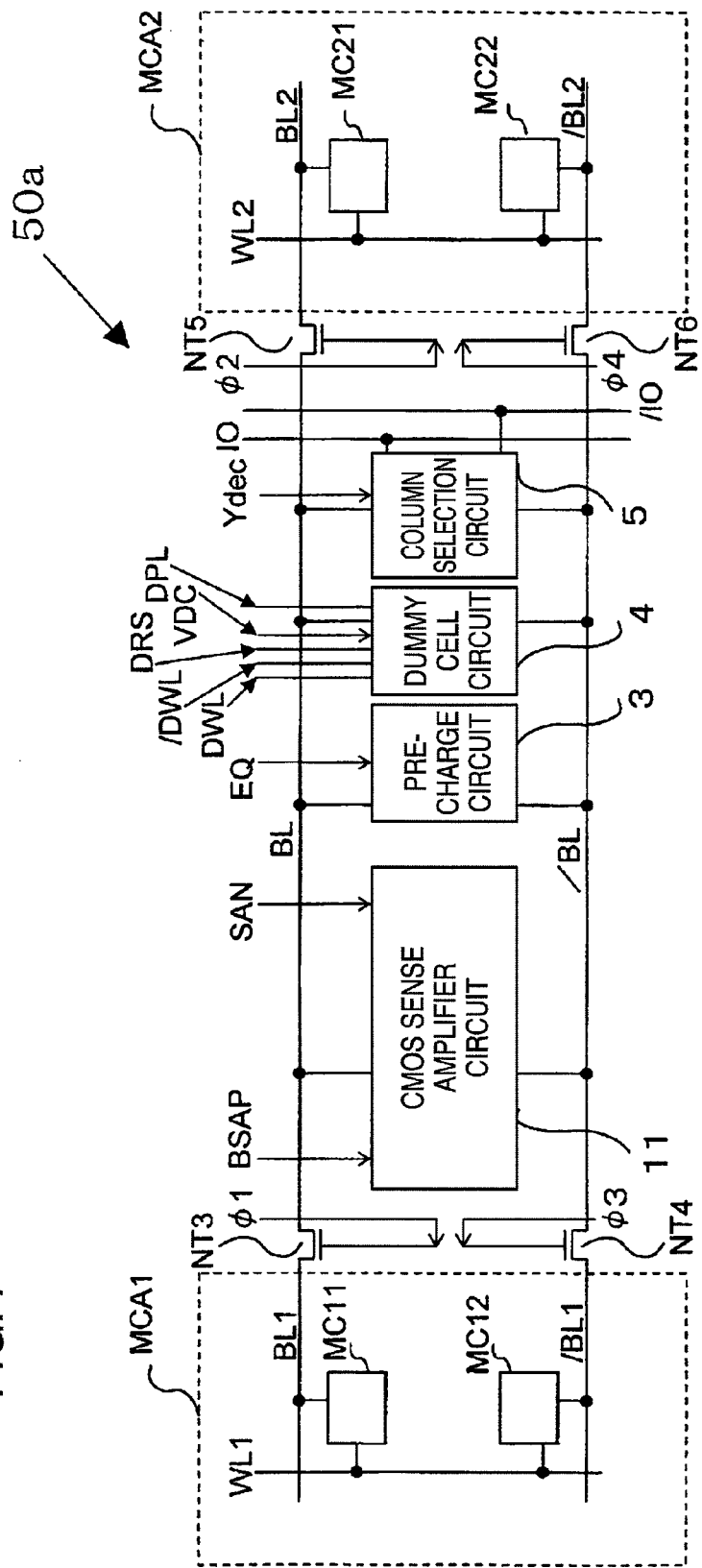
FIG. 7 is a circuit diagram showing a semiconductor memory apparatus of a comparative example related to the first embodiment.

First, a semiconductor memory apparatus according to a first embodiment of the invention will be described with reference to the drawings. FIG. 1 is a circuit diagram showing a semiconductor memory apparatus. FIG. 2 is a circuit diagram showing a PMOS sense circuit. FIG. 3 is a circuit diagram showing an NMOS sense circuit. FIG. 4 is a circuit diagram showing a precharge circuit. FIG. 5 is a circuit diagram showing a dummy cell circuit. FIG. 6 is a circuit diagram showing a column selection circuit. FIG. 7 is a circuit diagram showing a semiconductor memory apparatus of a comparative example. In this embodiment, a sense amplifier circuit is divided into a PMOS sense circuit and an NMOS sense circuit, and an NMOS sense circuit, a precharge circuit, a dummy cell circuit, and a column selection circuit are connected to a local bit line.

As shown in FIG. 1, a semiconductor memory apparatus 50 is provided with a PMOS sense circuit 1, an NMOS sense circuit 2, a precharge circuit 3, a dummy cell circuit 4, a column selection circuit 5, a separation circuit 6, a memory cell array MCA1, a memory cell array MCA2, and Nch MOS transistors NT3 to NT6. The semiconductor memory apparatus 50 is a DRAM (Dynamic Random Access Memory) that has a folded bit line structure, in which a bit line BL and a bit line /BL are arranged so as to be opposite each other, and uses a dummy cell reference scheme.

A MOS (Metal Oxide Semiconductor) transistor is also called a MOSFET (Metal Oxide Semiconductor Field Transistor MOS transistor), and a MIS (Metal Insulator Semiconductor) transistor is also called a MISFET (Metal Insulator Semiconductor Field Effect Transistor). A MOS transistor and a MIS transistor are also called an insulated gate field effect transistor.

The memory cell array MCA1 and the memory cell array MCA2 are arranged so as to be opposite each other centered on circuits and transistors for a read-out operation of a memory cell or the like. The memory cell array MCA1 is provided with memory cells MC11 and MC12. The memory cell array MCA2 is provided with memory cells MC21 and MC22.

The memory cell MC11 is connected to a bit line BL1 and a word line WL1, and the memory cell MC12 is connected to a bit line /BL1 and the word line WL1. The memory cell MC21 is connected to a bit line BL2 and a word line WL2, and the memory cell MC22 is connected to a bit line /BL2 and the word line WL2. The memory cell MC11, the memory cell MC12, the memory cell MC21, and the memory cell MC22 are 1T1C type memory cells, each having a memory cell transistor and a capacitor (not shown).

The Nch MOS transistor NT3 receives a control signal Φ1 as an input through a gate thereof, and connects or separates the bit line BL1 of the memory cell array MCA1 and the bit line BL to or from each other on the basis of the control signal Φ1. When the control signal Φ1 is at a High level, the bit line BL1 and the bit line BL are connected to each other, and when the control signal Φ1 is at a Low level, the bit line BL1 and the bit line BL are separated from each other.

The Nch MOS transistor NT4 receives the control signal Φ3 as an input through a gate thereof, and connects or separates the bit line /BL1 of the memory cell array MCA1 and the bit line /BL to or from each other on the basis of the control signal Φ3. When the control signal Φ3 is at the High level, the bit line /BL1 and the bit line /BL are connected to each other, and when the control signal Φ3 is at the Low level, the bit line /BL1 and the bit line /BL are separated from each other.

The Nch MOS transistors NT3 and NT4 are provided between the memory cell array MCA1 and the PMOS sense circuit 1, and function as a transfer gate (switch unit).

The Nch MOS transistor NT5 receives a control signal Φ2 as an input through a gate thereof, and connects or separates the bit line BL2 of the memory cell array MCA2 and the bit line BL to or from each other on the basis of the control signal Φ2. When the control signal Φ2 is at a High level, the bit line BL2 and the bit line BL are connected to each other, and when the control signal Φ2 is at a Low level, the bit line BL2 and the bit line BL are separated from each other.

The Nch MOS transistor NT6 receives the control signal Φ4 as an input through a gate thereof, and connects or separates the bit line /BL2 of the memory cell array MCA2 and the bit line /BL to or from each other on the basis of the control signal Φ4. When the control signal Φ4 is at the High level, the bit line /BL2 and the bit line /BL are connected to each other, and when the control signal Φ4 is at the Low level, the bit line /BL2 and the bit line /BL are separated from each other. The Nch MOS transistors NT5 and NT6 are provided between the memory cell array MCA2 and the PMOS sense circuit 1, and function as a transfer gate (switch unit).

The separation circuit 6 is provided between the PMOS sense circuit 1 and the NMOS sense circuit 2, and has the Nch MOS transistors NT1 and NT2. The separation circuit 6 serving as a switch unit connects or separates the bit line BL and a local bit line LBL, and the bit line /BL and a local bit line /LBL to or from each other on the basis of a control signal Φt. When the control signal Φt is at a High level, the bit line BL and the local bit line LBL are connected to each other, and the bit line /BL and the local bit line /LBL are connected to each other. When the control signal Φt is at a Low level, the bit line BL and the local bit line LBL are separated from each other, and the bit line /BL and the local bit line /LBL are separated from each other.

As shown in FIG. 2, the PMOS sense circuit 1 is connected to the bit line BL and the bit line /BL, and has Pch MOS transistors PT1 to PT3.

The Pch MOS transistor PT1 has a source and a drain, one of which is supplied with an array voltage VDL and the other one of which is connected to a node N1, and a gate to which a control signal BSAP is input. The Pch MOS transistor PT2 has a source and a drain, one of which is connected to the node N1 and the other one of which is connected to a node N2, and a gate which is connected to a node N3. Pch MOS transistor PT3 has a source and a drain, one of which is connected to the node N1 and the other one of which is connected to the node N3, and a gate which is connected to the node N2. The node N2 is connected to the bit line BL and the local bit line LBL. The node N3 is connected to the bit line /BL and the local bit line /LBL.

As shown in FIG. 3, the NMOS sense circuit 2 is connected to the local bit line LBL and the local bit line /LBL, and has Nch MOS transistors NT11 to NT13.

The PMOS sense circuit 1 and the NMOS sense circuit 2 amplifies information read out from a memory cell, and the NMOS sense circuit 2 outputs an amplified signal at a High level or a Low level.

The Nch MOS transistor NT11 has a source and a drain, one of which is connected to a low potential side power supply (ground potential) VSS and the other one of which is connected to a node N4, and a gate to which a control signal SAN is input. The Nch MOS transistor NT12 has a source and a drain, one of which is connected to the node N4 and the other one of which is connected to the local bit line LBL, and a gate which is connected to the local bit line /LBL. The Nch MOS transistor NT13 has a source and a drain, one of which is connected to the node N4 and the other one of which is connected to the local bit line /LBL, and a gate which is connected to the local bit line LBL.

As shown in FIG. 4, the precharge circuit 3 is connected to the local bit line LBL and the local bit line /LBL, and has Nch MOS transistors NT14 to NT16. The precharge circuit 3 receives a control signal EQ as an input, and carries out a precharge operation when the control signal EQ is at a High level.

The Nch MOS transistor NT14 has a source and a drain, one of which is connected to the local bit line LBL and the other one of which is connected to the local bit line /LBL, and a gate to which the control signal EQ is input. The Nch MOS transistor NT15 has a source and a drain, one of which is connected to the local bit line LBL and the other one of which is connected to the low potential side power supply (ground potential) VSS, and a gate to which the control signal EQ is input. The Nch MOS transistor NT16 has a source and a drain, one of which is connected to the local bit line /LBL and the other one of which is connected to the low potential side power supply (ground potential) VSS, and a gate to which the control signal EQ is input.

As shown in FIG. 5, the dummy cell circuit 4 is connected to the local bit line LBL and the local bit line /LBL, and has Nch MOS transistors NT17 to NT19 and a capacitor C1.

The Nch MOS transistor NT17 has a source and a drain, one of which is connected to the local bit line LBL and the other one of which is connected to a node N5, and a gate which is connected to a dummy word line /DWL. The Nch MOS transistor NT18 has a source and a drain, one of which is connected to the node N5, and the other one of which is connected to the local bit line /LBL, and a gate which is connected to a dummy word line DWL. The Nch MOS transistor NT19 has a source and a drain, one of which is supplied with a dummy cell voltage VDC and the other one of which is connected to the node N5, and a gate which is connected to a dummy reset line DRS. One end of the capacitor C1 serving as a dummy capacitor is connected to the node N5, and the other end of the capacitor C1 is connected to a dummy plate line DPL.

As shown in FIG. 6, the column selection circuit 5 is connected to the local bit line LBL and the local bit line /LBL, and has Nch MOS transistors NT20 and NT21.

The Nch MOS transistor NT20 has a source and a drain, one of which is connected to the local bit line LBL and the other one of which is connected to a signal line IO, and a gate to which a control signal Ydec is input. The Nch MOS transistor NT21 has a source and a drain, one of which is connected to the local bit line /LBL and the other one of which is connected to a signal line /IO, and a gate to which the control signal Ydec is input.

As shown in FIG. 7, a semiconductor memory apparatus 50a of a comparative example is provided with a CMOS sense amplifier circuit 11, a precharge circuit 3, a dummy cell circuit 4, a column selection circuit 5, a memory cell array MCA1, a memory cell array MCA2, and Nch MOS transistors NT3 to NT6. The semiconductor memory apparatus 50a is a DRAM that has a folded bit line structure, in which a bit line BL and a bit line /BL are arranged so as to be opposite each other, and uses a dummy cell reference scheme.

The semiconductor memory apparatus 50a of the comparative example is not provided with the separation circuit 6, the local bit line LBL, and the local bit line /LBL. The semiconductor memory apparatus 50a is provided with the CMOS sense amplifier circuit 11, instead of the PMOS sense circuit 1 and the NMOS sense circuit 2.

Though not shown, the CMOS sense circuit 11 includes the PMOS sense circuit 1 and the NMOS sense circuit 2 of the embodiment. The CMOS sense circuit 11 is a latch-type sense amplifier circuit that receives the control signals BSAP and SAN as an input, amplifies voltage information read out from the memory cells, and outputs an amplified signal. The CMOS sense amplifier circuit 11, the precharge circuit 3, the dummy cell circuit 4, and the column selection circuit 5 are connected to the bit line BL and the bit line /BL.

Figure 8:
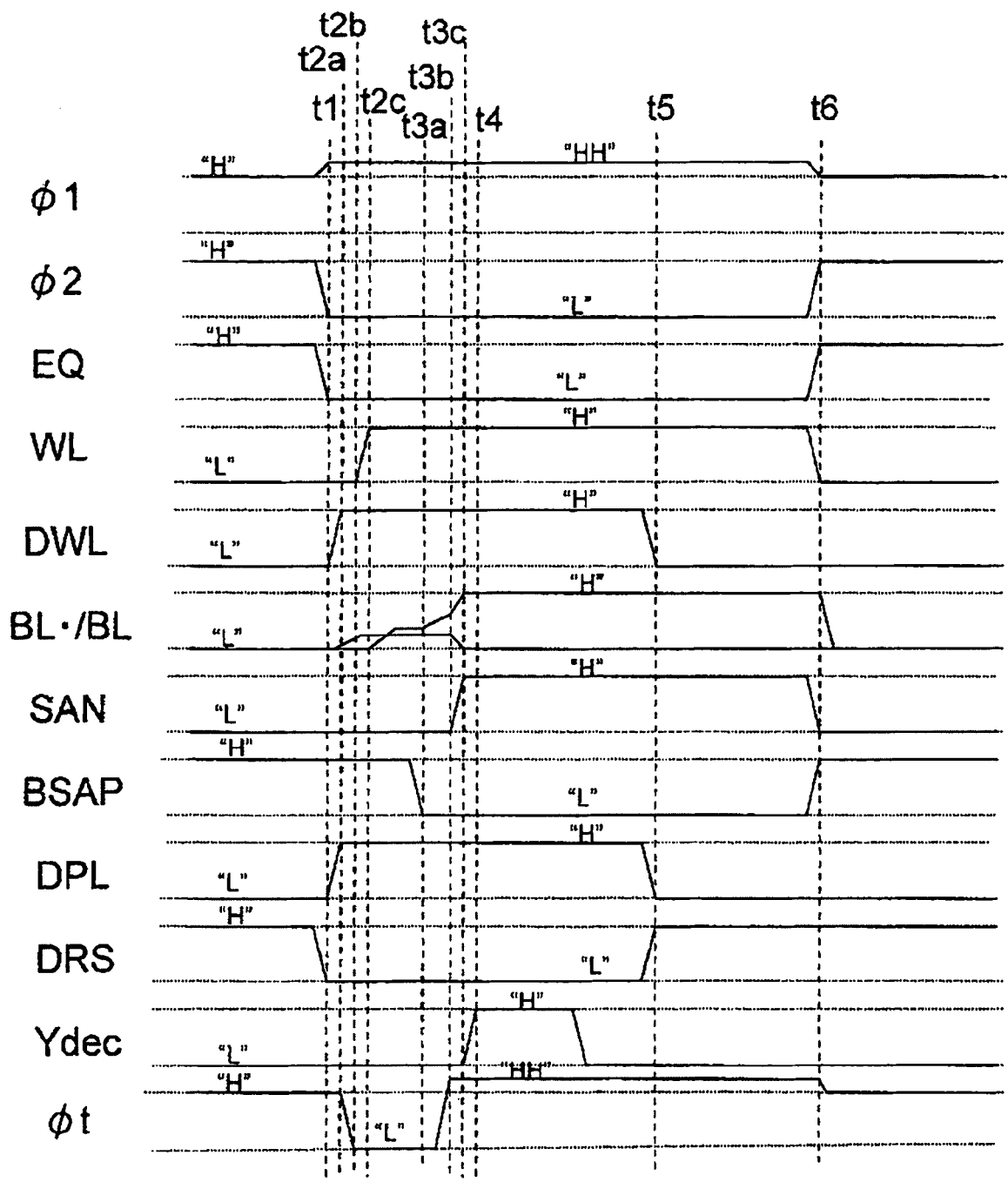
FIG. 8 is a timing chart showing a read-out operation of the semiconductor memory apparatus according to the first embodiment.
Figure 9:
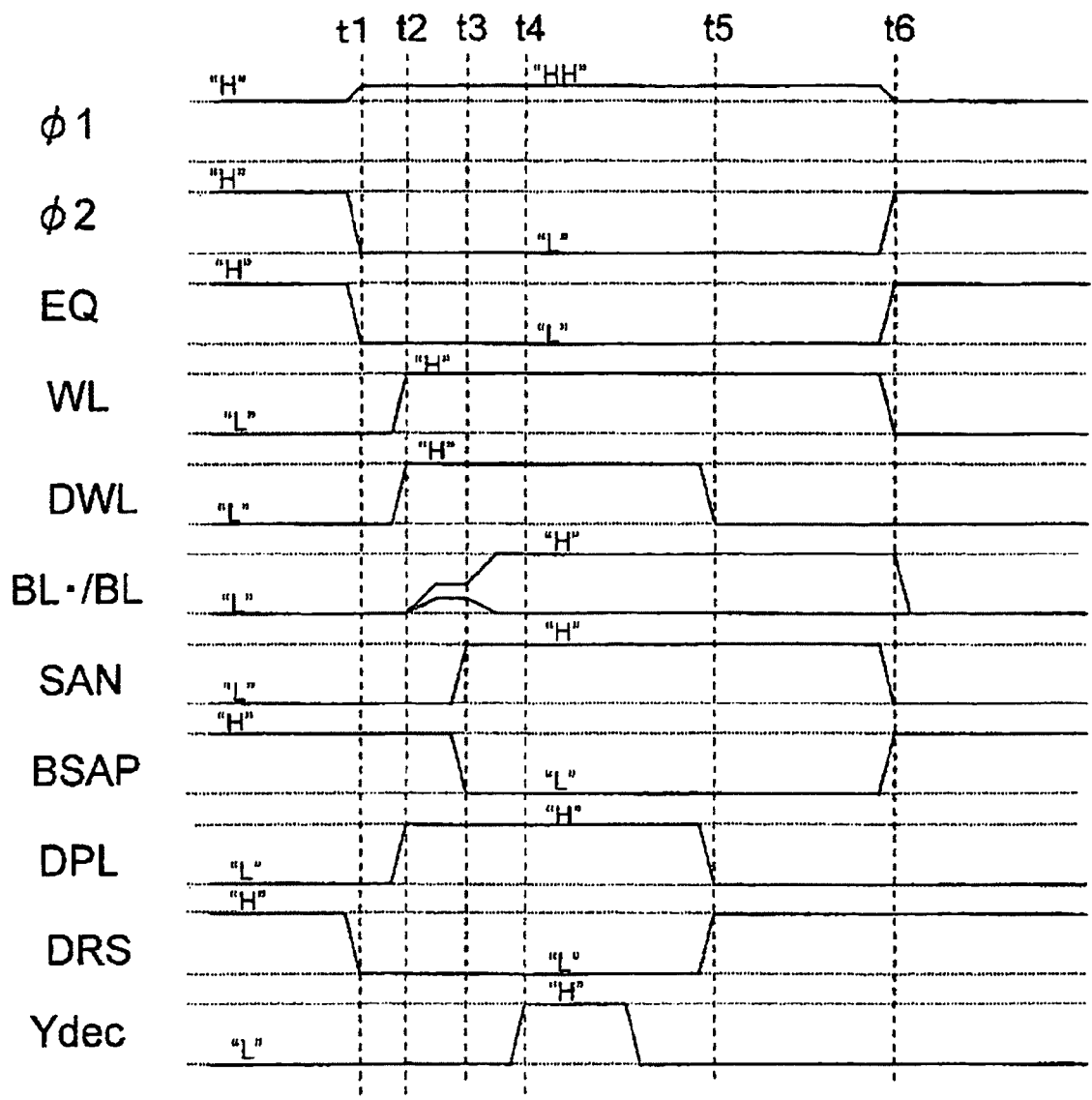
FIG. 9 is a timing chart showing a read-out operation of the semiconductor memory apparatus of the comparative example related to the first embodiment.

Next, the operation of the semiconductor memory apparatus will be described with reference to FIGS. 8 and 9. FIG. 8 is a timing chart showing the read-out operation of the semiconductor memory apparatus of this embodiment. FIG. 9 is a timing chart showing the read-out operation of the semiconductor memory apparatus of the comparative example. In this case, the read-out operation when the memory cell MC11 is selected will be described.

As shown in FIG. 8, in the semiconductor memory apparatus 50 of this embodiment, at the time of precharging before reading-out of information stored in the memory cell MC11, during a period till a time t1, the control signal EQ, the control signal $\Phi 1$, the control signal $\Phi 2$, the control signal $\Phi 3$, the control signal $\Phi 4$ and the dummy reset line DRS are at the High level, and the control signal $\Phi t$ is also at the High level. The Nch MOS transistors NT1 to NT6 are turned on. As a result, the bit lines BL and /BL and the local bit lines LBL and /LBL are precharged to a Low level, and the bit lines BL1 and /BL1 of the memory cell array MCA1 and the bit lines BL2 and /BL2 of the memory cell array MCA2 are precharged to a Low level.

The PMOS sense circuit 1 is in a standby state when the control signal BSAP is at the High level. The NMOS sense circuit 2 is in a standby state when the control signal SAN is at the Low level.

The dummy cell circuit 4 is separated from the local bit line LBL and the local bit line /LBL when the dummy word line DWL and the dummy word line /DWL (not shown) are at the Low level. In the dummy cell circuit 4, when the dummy reset line DRS is at the High level, one node (the node N5 side) of the capacitor C1 serving as a dummy capacitor is precharged with the dummy cell voltage VDC, and the other end (the dummy plate line DPL side) of the capacitor C1 is set at the Low level.

The column selection circuit 5 is separated from the signal lines IO and /IO when the control signal Ydec is at the Low level.

Next, if a time t1 is reached at which the read-out operation of the semiconductor memory apparatus 50 starts, the control signal $\Phi 1$ serving as a transfer gate signal of the memory cell to be selected is boosted from the High level to a HH level (a potential higher than the High level), and the control signal $\Phi 2$, $\Phi 3$ and $\Phi 4$ serving as a transfer gate signal of the unselected memory cells are set from the High level to the Low level. As a result, the bit line BL and the bit line BL1 are connected to each other, the bit line /BL and the bit line /BL1 are separated each other, the bit line BL and the bit line BL2 are separated from each other, and the bit line /BL and the bit line /BL2 are separated from each other.

In the precharge circuit 3, when the control signal EQ is set from the High level to the Low level, and the control signal Φt is at the High level, the local bit line LBL and the local bit line /LBL are cut off from each other, and the bit line BL and the bit line /BL are cut off from each other. Thus, the precharge circuit 3 is put in a floating state.

In the dummy cell circuit 4, the dummy reset line DRS is set from the High level to the Low level, and the dummy cell voltage VDC is not supplied to the node N5. Thus, the dummy cell circuit 4 is put in a floating state.

Subsequently, if a time t2a is reached, in the dummy cell circuit 4, the dummy word line DWL is set from the Low level to the High level, and the dummy plate line DPL is set from the Low level to the High level. A signal of a dummy cell of the dummy cell circuit 4 is output to the local bit line /LBL and is then output to the bit line /BL through the separation circuit 6.

Next, if a time t2b is reached, in the separation circuit 6, the control signal Φt is set from the High level to the Low level. Then, the bit line BL and the local bit line LBL are separated from each other, and the bit line /BL and the local bit line /LBL are separated from each other.

Next, if a time t2c is reached, the word line WL1 that is connected to the selected memory cell MC11 is set from the Low level to the High level, and information of the memory cell MC11 is output to the bit line BL through the bit line BL1.

Subsequently, if a time t3a is reached, the control signal BSAP is set from the High level to the Low level. Then, the PMOS sense circuit 2 starts the amplification operation of the bit line potential, compares the signal level of the memory cell with the signal level of the dummy cell, and amplifies a high potential to a higher level.

Next, if a time t3b is reached (after the amplification operation of the PMOS sense circuit 2), in the separation circuit 6, the control signal Φt is set from the Low level to the HH level. Then, the bit line BL and the local bit line LBL are connected to each other, and the bit line /BL and the local bit line /LBL are connected to each other.

Next, if a time t3c is reached, in the NMOS sense circuit 2, the control signal SAN is set from the Low level to the High level, a pair of the bit line BL and the bit line /BL and a pair of the local bit line LBL and the local bit line /LBL are set at the High level and the Low level by the amplification operation of the NMOS sense circuit 2. That is, the information read out from the memory cell MC11 is set at the High level or the Low level by the amplification operations of the PMOS sense circuit 1 and the NMOS sense circuit 2.

Next, if a time t4 is reached, in the column selection circuit 5, the control signal Ydec is set from the Low level to the High level. Then, information on the bit line BL is transferred to the signal line IO, and information on the bit line /BL is transferred to the signal line /IO.

After the control signal Ydec is changed from the High level to the Low level, if a time t5 is reached, the dummy word line DWL and the dummy plate line DPL are set from the High level to the Low level, and the dummy reset line DRS is set from the Low level to the High level. Thus, the dummy cell circuit 4 is put in a precharge state.

Next, if a time t6 is reached, the control signals Φ1, Φ2, Φ3, Φ3, EQ, BSAP, and Φt are set at the High level, and the control signal SAN is set at the Low level. Thus, the state (precharge state) before the time t1 is enabled.

As shown in FIG. 9, in the semiconductor memory apparatus 50a of the comparative example, at the time of precharging before reading-out of information of the memory cell MC11, during a period till a time t1, the control signal EQ, the control signal Φ1, the control signal Φ2, the control signal Φ3, the control signal Φ4, and the dummy reset line DRS are at the High level, and the Nch MOS transistors NT3 to NT6 are turned on. As a result, the bit lines BL and /BL are precharged to the Low level, and the bit lines BL1 and /BL1 of the memory cell array MCA1 and the bit lines BL2 and /BL2 of the memory cell array MCA2 are precharged to the Low level.

The CMOS sense amplifier circuit 11 is in a standby state when the control signal BSAP is at the High level and the control signal SAN is at the Low level. The dummy cell circuit 4 is separated from a pair of the bit line BL and the bit line /BL when the dummy word line DWL and the dummy word line /DWL (not shown) are at the Low level. In the dummy cell circuit 4, when the dummy reset line DRS is at the High level, one end (the node N5 side) of the capacitor C1 serving as a dummy capacitor is precharged with the dummy cell voltage VDC, and the other end (the dummy plate line DPL side) of the capacitor C1 is set at the Low level.

The column selection circuit 5 is separated from the signal lines IO and /IO when the control signal Ydec is at the Low level.

Next, if the time t1 is reached at which the read-out operation of the semiconductor memory apparatus 50a starts, the control signal Φ1 serving as a transfer gate signal of the memory cell to be selected is boosted from the High level to the HH level (a potential higher than the High level), and the control signal Φ2, Φ3 and Φ4 serving as a transfer gate signal of the unselected memory cells are set from the High level to the Low level. As a result, the bit line BL and the bit line BL1 are connected to each other, the bit line /BL and the bit line /BL1 are separated from each other, the bit line BL and the bit line BL2 are separated from each other, and the bit line /BL and the bit line /BL2 are separated from each other.

In the precharge circuit 3, the control signal EQ is set from the High level to the Low level, and the bit line BL and the bit line /BL are cut off from each other. Thus, the precharge circuit 3 is put in a floating state.

In the dummy cell circuit 4, the dummy reset line DRS is set from the High level to the Low level, and the dummy cell voltage VDC is not supplied to the node N5. Thus, the dummy cell circuit 4 is put in a floating state.

Subsequently, if a time t2 is reached, the word line WL1 that is connected to the selected memory cell MC11 is set from the Low level to the High level, and information of the memory cell MC11 is output to the bit line BL. In the dummy cell circuit 4, the dummy word line DWL is set from the Low level to the High level, and the dummy plate line DPL is set from the Low level to the High level. A signal of a dummy cell of the dummy cell circuit 4 is output to the bit line /BL.

Next, if a time t3 is reached, in the CMOS sense amplifier circuit 11, the control signal SAN is set from the Low level to the High level, the control signal BSAP is set from the High level to the Low level. Then, the CMOS sense amplifier circuit 11 amplifies the signals on a pair of the bit line BL and the bit line /BL. The operation after a time t4 is the same as this embodiment, and thus a description thereof will be omitted.

Next, the sense operation margin and the read-out speed are compared between the semiconductor memory apparatus 50 of this embodiment and the semiconductor memory apparatus 50a of the comparative example.

Let a read-out signal voltage be Vs, capacitance of a memory cell be Cs, bit line capacitance be Cb, a memory cell voltage be Vcell, and a bit line voltage be Vbl, then, the following equations are obtained.

$$Vs = Cs/\{(Cb+Cs) \times (Vcell - Vbl)\} \quad \text{Equation (1)}$$

$$Vs \propto Cs/(Cb+Cs) \quad \text{Equation (2)}$$

In the semiconductor memory apparatus 50 of this embodiment, the PMOS sense circuit 1 is connected to the bit lines BL and /BL, the NMOS sense circuit 2, the precharge circuit 3, the dummy cell circuit 4, and the column selection circuit 5 are connected to the local bit lines LBL and /LBL. Meanwhile, in the semiconductor memory apparatus 50a of the comparative example, the CMOS sense amplifier circuit 11, the precharge circuit 3, the dummy cell circuit 4, and the column selection circuit 5 are connected to the bit lines BL and /BL.

In the case of the semiconductor memory apparatus 50a of the comparative example, parasitic capacitance of the CMOS sense amplifier circuit 11, the precharge circuit 3, the dummy cell circuit 4, and the column selection circuit 5 accounts for 25% to 35% of a bit line capacitance Cb2. In the case of the semiconductor memory apparatus 50 of this embodiment, parasitic capacitance of the NMOS sense circuit 2, the precharge circuit 3, the dummy cell circuit 4, and the column selection circuit 5 does not become bit line parasitic capacitance. For this reason, a percentage of parasitic capacitance of the PMOS sense circuit 1 in a bit line capacitance Cb1 is significantly small.

Therefore, the relationship between the bit line capacitance Cb1 of the semiconductor memory apparatus 50 of this embodiment and the bit line capacitance Cb2 of the semiconductor memory apparatus 50a of the comparative example, and the relationship between a read-out signal voltage Vs1 of the semiconductor memory apparatus 50 of this embodiment and a read-out signal voltage Vs2 of the semiconductor memory apparatus 50a of the comparative example are expressed by the following equations.

$$Cb1 << Cb2 \quad \text{Equation (3)}$$

$$Vs1 >> Vs2 \quad \text{Equation (4)}$$

The relationship between a sense speed Ssn of the read-out operation and the bit line capacitance Cb is expressed by the following equation.

$$Ssn \propto 1/Cb \quad \text{Equation (5)}$$

Therefore, the relationship between the sense speed Ssn1 of the semiconductor memory apparatus 50 of this embodiment and the sense speed Ssn2 of the semiconductor memory apparatus 50a of the comparative example is expressed by the following equation from Equation (3).

$$Ssn1 >> Ssn2 \quad \text{Equation (6)}$$

The semiconductor memory apparatus 50 of this embodiment can significantly suppress a change in the bit line signal voltage, as compared with the semiconductor memory apparatus 50a of the comparative example.

As described above, the semiconductor memory apparatus of this embodiment is provided with the PMOS sense circuit 1, the NMOS sense circuit 2, the precharge circuit 3, the dummy cell circuit 4, the column selection circuit 5, the separation circuit 6, the memory cell array MCA1, the memory cell array MCA2, and the Nch MOS transistors NT3 to NT6. The PMOS sense circuit 1 is connected to the bit lines BL and /BL. The NMOS sense circuit 2, the precharge circuit 3, the dummy cell circuit 4, and the column selection circuit 5 are connected to the local bit lines LBL and /LBL. The separation circuit 6 is provided between the PMOS sense circuit 1 and the NMOS sense circuit 2, and has the Nch MOS transistors NT1 and NT2. The separation circuit 6 connects or separates the bit lines BL and the local bit line LBL, and the bit line /BL and the local bit line /LBL to or from each other on the basis of the control signal Φt. When the PMOS sense circuit 1 amplifies information read out from the memory cell, the separation circuit 6 separates the bit line BL and the local bit line LBL, and the bit line /BL and the local bit line /LBL from each other. When the NMOS sense circuit 2 amplifies information of the memory cell amplified by the PMOS sense circuit 1 to the High level or the Low level, the bit line BL and the local bit line LBL, and the bit line /BL and the local bit line /LBL are connected to each other.

For this reason, parasitic capacitance of the bit lines BL and /BL can be reduced, and the bit line capacitance Cb can be reduced, as compared with the comparative example. Therefore, the sense operation margin of the semiconductor memory apparatus 50 can be improved. In addition, even if the semiconductor memory apparatus 50 is miniaturized, it is not necessary to reduce the number of memory cells to be connected to the bit lines BL and /BL, and it is possible to suppress an increase in the chip area of the semiconductor memory apparatus 50. Furthermore, parasitic capacitance of the bit lines BL and /BL can be reduced, and thus the sense speed of the semiconductor memory apparatus 50 can be increased.

In this embodiment, the PMOS sense circuit 1, the NMOS sense circuit 2, the precharge circuit 3, the dummy cell circuit 4, the column selection circuit 5, and the like are formed by MOS transistors, but MIS transistors may be used. The invention is applied to a DRAM, but it may be applied to a FeRAM (Ferroelectric Random Access Memory).

Second Embodiment

Figure 10:
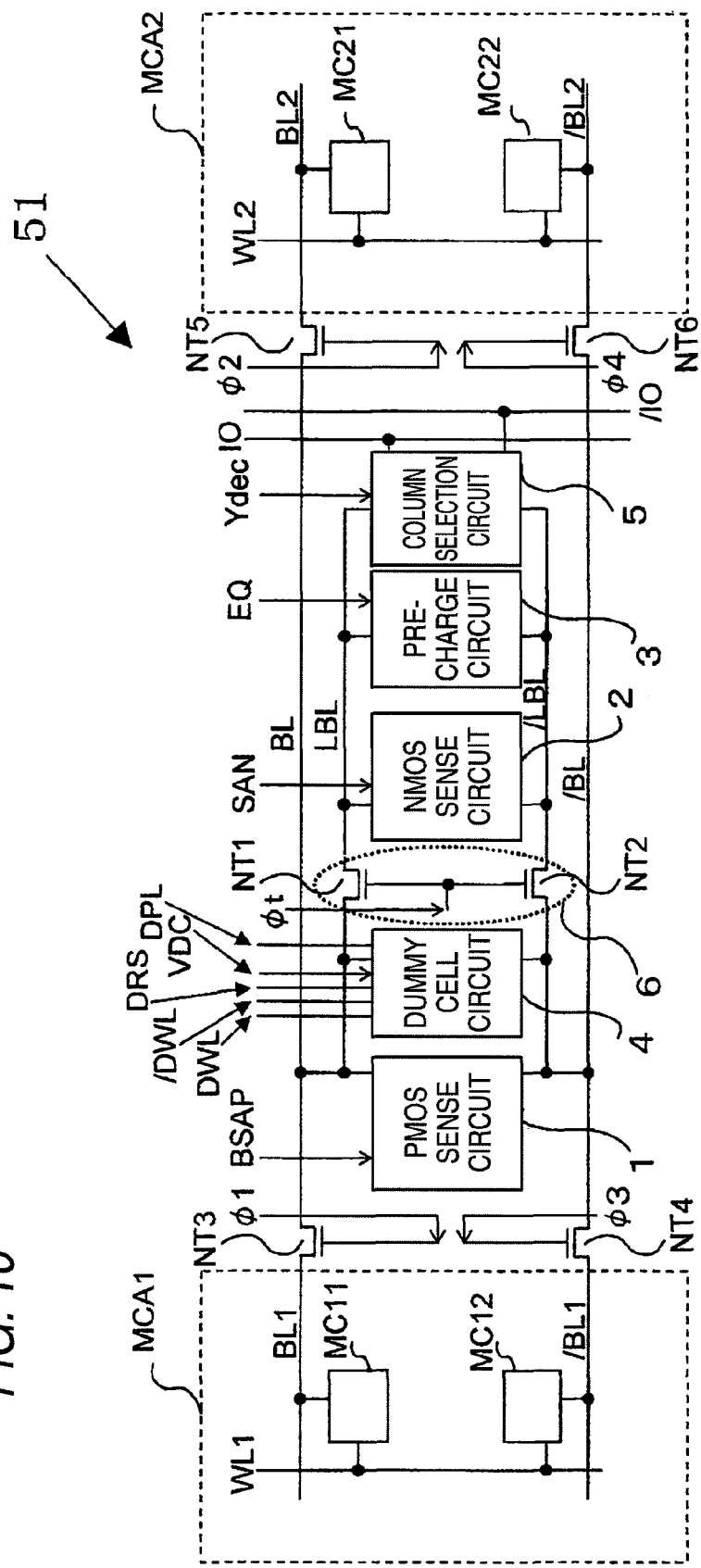
FIG. 10 is a circuit diagram showing a semiconductor memory apparatus according to a second embodiment of the invention.

Next, a semiconductor memory apparatus according to a second embodiment of the invention will be described with reference to the drawings. FIG. 10 is a circuit diagram showing a semiconductor memory apparatus. In this embodiment, a sense amplifier is divided into a PMOS sense circuit and an NMOS sense circuit. A PMOS sense circuit and a dummy cell circuit are connected to bit lines, and an NMOS sense circuit, a precharge circuit, and a column selection circuit are connected to local bit lines.

As shown in FIG. 10, a semiconductor memory apparatus 51 is provided with a PMOS sense circuit 1, an NMOS sense circuit 2, a precharge circuit 3, a dummy cell circuit 4, a column selection circuit 5, a separation circuit 6, a memory cell array MCA1, a memory cell array MCA2, and Nch MOS transistors NT3 to NT6. The semiconductor memory apparatus 51 is a DRAM (Dynamic Random Access Memory) that has a folded bit line structure, in which a bit line BL and a bit line /BL are arranged so as to be opposite each other, and uses a dummy cell reference scheme.

The PMOS sense circuit 1 and the dummy cell circuit 4 are connected to the bit lines BL and /BL. The NMOS sense circuit 2, the precharge circuit 3, and the column selection circuit 5 are connected to the local bit lines LBL and /LBL.

The separation circuit 6 is provided between the dummy cell circuit 4 and the NMOS sense circuit 2. The separation circuit 6 serving as a switch unit connects or separates the bit line BL and the local bit line LBL, and the bit line /BL and the local bit line /LBL to or from each other on the basis of the control signal Φt. When the control signal Φt is at the High level, the bit line BL and the local bit line LBL, the bit line /BL and the local bit line /LBL are connected to each other. When the control signal Φt is at the Low level, the bit line BL and the local bit line LBL, and the bit line /BL and the local bit line /LBL are separated from each other. The arrangement other than the precharge circuit 3, the dummy cell circuit 4, and the separation circuit 6 is the same as the first embodiment (the circuit structure is also the same), and a description thereof will be omitted.

Figure 11:
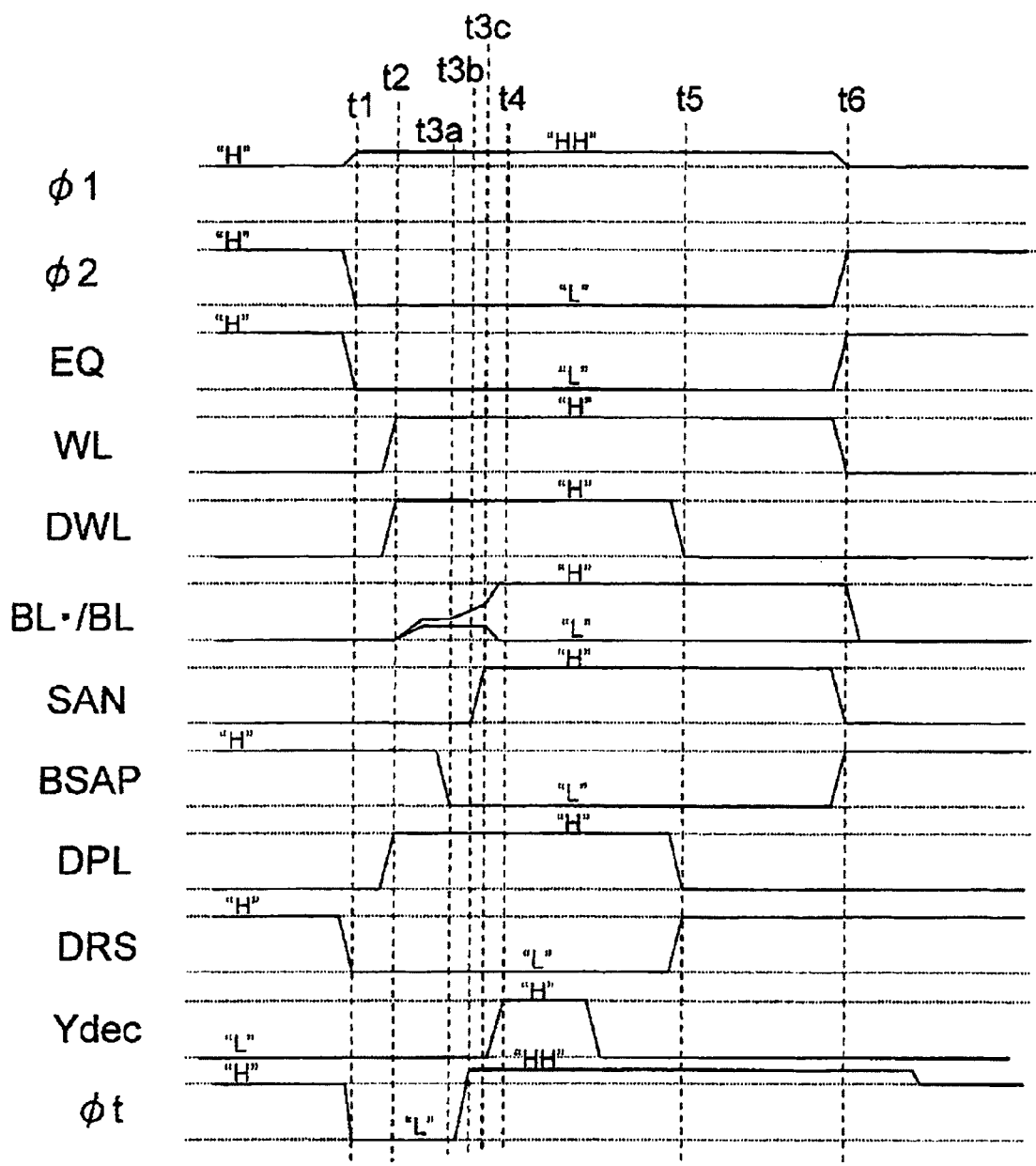
FIG. 11 is a timing chart showing a read-out operation of the semiconductor memory apparatus according to the second embodiment.

Next, the operation of the semiconductor memory apparatus will be described with reference to FIG. 11. FIG. 11 is a timing chart showing a read-out operation of a semiconductor memory apparatus. In this case, the read-out operation when the memory cell MC11 is selected will be described.

As shown in FIG. 11, in the semiconductor memory apparatus 51, at the time of precharging before reading-out of information stored in the memory cell MC11, during a period till the time t1, the control signal EQ, the control signal Φ1, the control signal Φ2, the control signal Φ3, the control signal Φ4, and the dummy reset line DRS are at the High level, and the control signal Φt is also at the High level. The Nch MOS transistors NT1 to NT6 are turned on. As a result, the bit lines BL and /BL and the local bit lines LBL and /LBL are precharged to the Low level, and the bit lines BL1 and /BL1 of the memory cell array MCA1 and the bit lines BL2 and /BL2 of the memory cell array MCA2 are precharged to the Low level.

The PMOS sense circuit 1 is in the standby state when the control signal BSAP is at the High level. The NMOS sense circuit 2 is in the standby state when the control signal SAN is at the Low level.

The dummy cell circuit 4 is separated from the local bit line LBL and the local bit line /LBL when the dummy word line DWL and the dummy word line /DWL (not shown) are at the Low level. In the dummy cell circuit 4, when the dummy reset line DRS is at the High level, one end (the node N5 side) of the capacitor C1 serving as a dummy capacitor is precharged with the dummy cell voltage VDC, and the other end (the dummy plate line DPL side) of the capacitor C1 is set at the Low level.

The column selection circuit 5 is separated from the signal lines IO and /IO when the control signal Ydec is at the Low level.

Next, if the time t1 is reached at which the read-out operation of the semiconductor memory apparatus 51 starts, the control signal Φ1 serving as a transfer gate signal of the memory cell to be selected is boosted from the High level to the HH level (a potential higher than the High level), and the control signal Φ2, Φ3 and Φ4 serving as a transfer gate signal of the unselected memory cells are set from the High level to the Low level. As a result, the bit line BL and the bit line BL1 are connected to each other, the bit line /BL and the bit line /BL1 are separated from each other, the bit line BL and the bit line BL2 are separated from each other, and the bit line /BL and the bit line /BL2 are separated from each other.

In the precharge circuit 3, when the control signal EQ is set from the High level to the Low level, and the control signal Φt is at the High level, the local bit line LBL and the local bit line /LBL are cut off from each other, and the bit line BL and the bit line /BL are cut off from each other. Thus, the precharge circuit 3 is put in the floating state.

In the dummy cell circuit 4, the dummy reset line DRS is set from the High level to the Low level, and the dummy cell voltage VDC is not supplied to the node N5. Thus, the dummy cell circuit 4 is put in the floating state.

The control signal Φt is set from the High level to the Low level. Then, the bit line BL and the local bit line LBL are separated from each other, and the bit line /BL and the local bit line /LBL are separated from each other.

Subsequently, if the time t2 is reached, the word line WL1 that is connected to the selected memory cell MC11 is set from the Low level to the High level, and information of the memory cell MC11 is output to the bit line BL through the bit line BL1.

In the dummy cell circuit 4, the dummy word line DWL is set from the Low level to the High level, and the dummy plate line DPL is set from the Low level to the High level. A signal of a dummy cell of the dummy cell circuit 4 is output to the bit line /BL.

After the signal of the memory cell is output to the bit line BL, and the signal of the dummy cell is output to the bit line /BL, if the time t3a is reached, the control signal BSAP is set from the High level to the Low level. Then, the PMOS sense circuit 2 starts the amplification operation of the bit line potential, compares the signal level of the memory cell with the signal level of the dummy cell, and amplifies a high potential to a higher level.

Next, if the time t3b is reached (after the amplification operation of the PMOS sense circuit 2), in the separation circuit 6, the control signal Φt is set from the Low level to the HH level. Then, the bit line BL and the local bit line LBL are connected to each other, and the bit line /BL and the local bit line /LBL are connected to each other.

Subsequently, if the time t3c is reached, in the NMOS sense circuit 2, the control signal SAN is set from the Low level to the High level. Then, a pair of the bit line BL and the bit line /BL and a pair of the local bit line LBL and the local bit line /LBL are set at the High level and the Low level by the amplification operation of the NMOS sense circuit 2. That is, information read out from the memory cell MC11 is set at the High level or the Low level by the amplification operations of the PMOS sense circuit 1 and the NMOS sense circuit 2.

Next, if the time t4 is reached, in the column selection circuit 5, the control signal Ydec is set from the Low level to the High level. Then, information on the bit line BL is transferred to the signal line IO, and information on the bit line /BL is transferred to the signal line /IO.

Next, after the control signal Ydec is changed from the High level to the Low level, if the time t5 is reached, in the dummy cell circuit 4, the dummy word line DWL and the dummy plate line DPL are set from the High level to the Low level, and the dummy reset line DRS is set from the Low level to the High level. Thus, the dummy cell circuit 4 is put in the precharge state.

Subsequently, if the time t6 is reached, the control signals Φ1, Φ2, Φ3, Φ4, EQ, BSAP, and Φt are set at the High level, and the control signal SAN is at the Low level. Thus, the state (precharge state) before the time t1 is enabled.

As described above, the semiconductor memory apparatus of this embodiment is provided with the PMOS sense circuit 1, the NMOS sense circuit 2, the precharge circuit 3, the dummy cell circuit 4, the column selection circuit 5, the separation circuit 6, the memory cell array MCA1, the memory cell array MCA2, and the Nch MOS transistors NT3 to NT6. The PMOS sense circuit 1 and the dummy cell circuit 4 are connected to the bit lines BL and /BL. The NMOS sense circuit 2, the precharge circuit 3, and the column selection circuit 5 are connected to the local bit lines LBL and /LBL. The separation circuit 6 is provided between the dummy cell circuit 4 and the NMOS sense circuit 2, and has the Nch MOS transistors NT1 and NT2. The separation circuit 6 connects or separates the bit line BL and the local bit line LBL, and the bit line /BL and the local bit line /LBL to or from each other on the basis of the control signal Φt. When the PMOS sense circuit 1 amplifies information read out from the memory cell, the separation circuit 6 separates the bit line BL and the local bit line LBL, and the bit line /BL and the local bit line /LBL from each other. When the NMOS sense circuit 2 amplifies information of the memory cell amplified by the PMOS sense circuit 1 to the High level or the Low level, the bit line BL and the local bit line LBL, and the bit line /BL and the local bit line /LBL are connected to each other.

For this reason, in addition to the effects of the first embodiment, the read-out sequence of the semiconductor memory apparatus 51 can be simplified, as compared with the first embodiment. Therefore, the operation control of the dummy cell circuit 4 can be improved.

Third Embodiment

Figure 12:
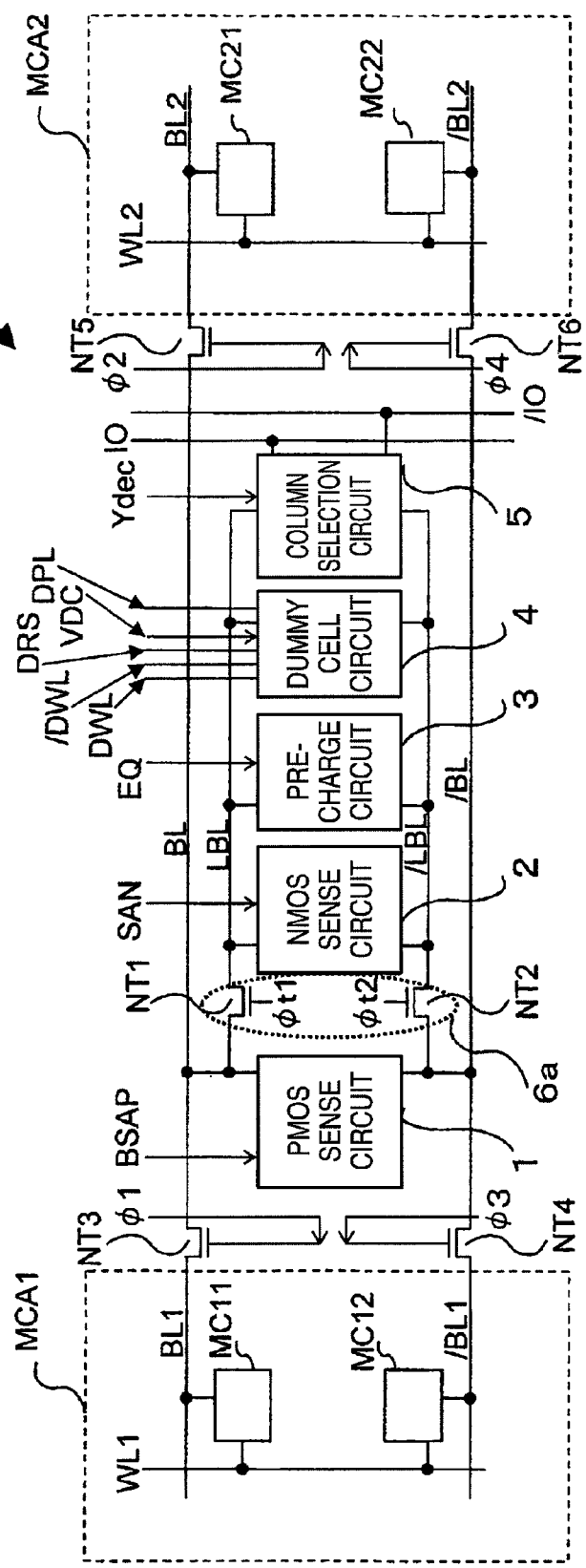
FIG. 12 is a circuit diagram showing a semiconductor memory apparatus according to a third embodiment of the invention.

Next, a semiconductor memory apparatus according to a third embodiment of the invention will be described with reference to the drawings. FIG. 12 is a circuit diagram showing a semiconductor memory apparatus. In this embodiment, two transistors forming a separation circuit are separately controlled.

As shown in FIG. 12, a semiconductor memory apparatus 52 is provided with a PMOS sense circuit 1, an NMOS sense circuit 2, a precharge circuit 3, a dummy cell circuit 4, a column selection circuit 5, a separation circuit 6a, a memory cell array MCA1, a memory cell array MCA2, and Nch MOS transistors NT3 to NT6. The semiconductor memory apparatus 52 is a DRAM that has a folded bit line structure, in which a bit line BL and a bit line /BL are arranged so as to be opposite each other, and uses a dummy cell reference scheme.

The separation circuit 6a serving as a switch unit is provided between the PMOS sense circuit 1 and the NMOS sense circuit 2, and has Nch MOS transistors NT1 and NT2.

The Nch MOS transistor NT1 connects or separates the bit line BL and the local bit line LBL to or from each other on the basis of a control signal $\Phi 1$. When the control signal $\Phi 1$ is at a High level, the bit line BL and the local bit line LBL are connected to each other. When the control signal $\Phi 1$ is at a Low level, the bit line BL and the local bit line LBL are separated from each other.

The Nch MOS transistor NT2 connects or separates the bit line /BL and the local bit line /LBL to or from each other on the basis of a control signal $\Phi t2$. When the control signal $\Phi t2$ is at a High level, the bit line /BL and the local bit line /LBL are connected to each other. When the control signal $\Phi t2$ is at a Low level, the bit line /BL and the local bit line /LBL are separated from each other. The structure other than the separation circuit 6a is the same as the first embodiment (the circuit structure is also the same), and thus a description will be omitted.

Figure 13:
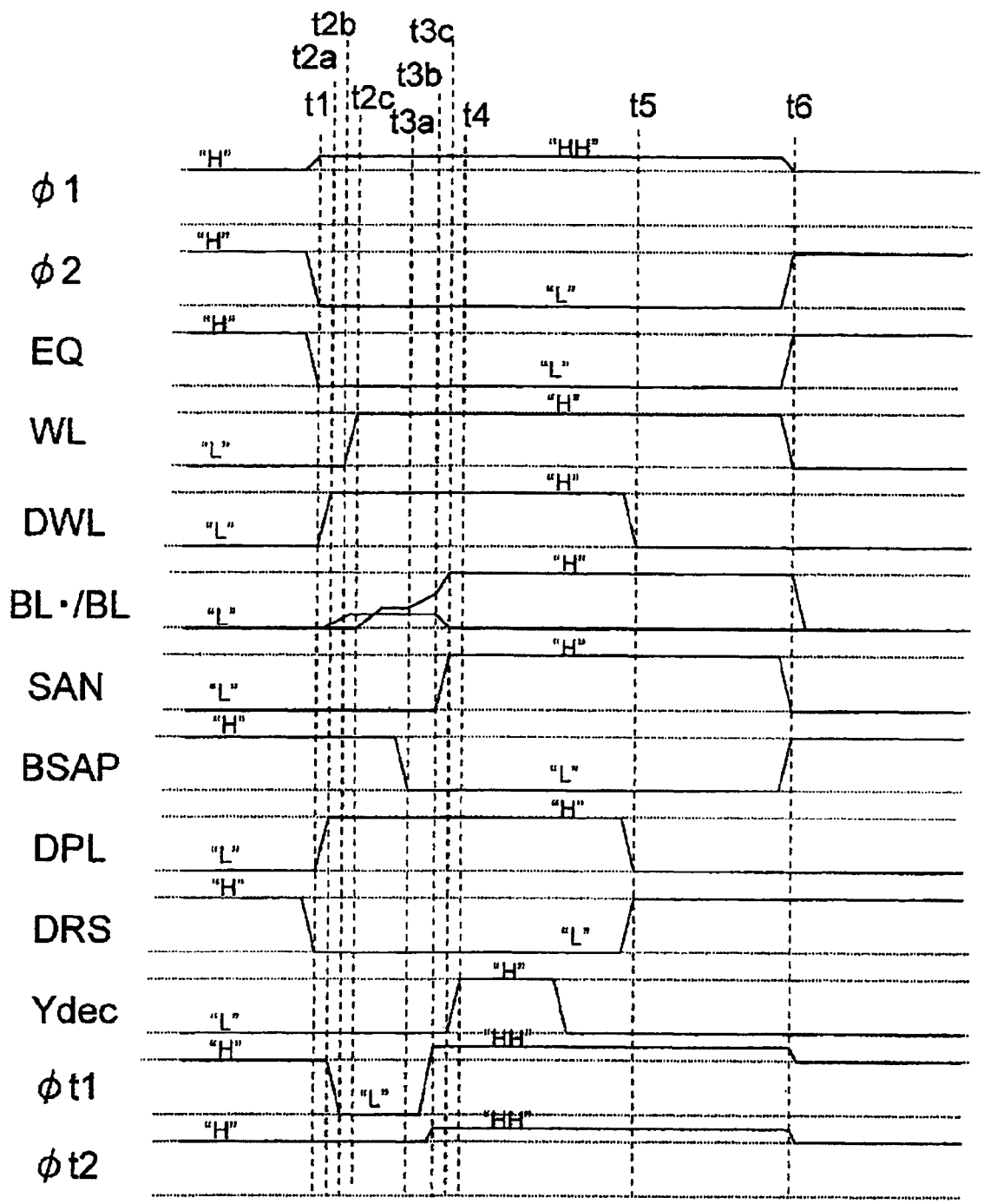
FIG. 13 is a timing chart showing a read-out operation of the semiconductor memory apparatus according to the third embodiment.

Next, the operation of the semiconductor memory apparatus will be described with reference to FIG. 13. FIG. 13 is a timing chart showing a read-out operation of a semiconductor memory apparatus. In this case, the read-out operation when the memory cell MC11 is selected will be described. The operation other than the separation circuit 6a is the same as the first embodiment, and thus only a difference will be described.

As shown in FIG. 13, in the semiconductor memory apparatus 52 of this embodiment, at the time of precharging before reading-out of information stored in the memory cell MC11, during a period till the time t1, the control signals $\Phi t1$ and $\Phi t2$ are at the High level, and the Nch MOS transistors NT1 and NT2 are turned on.

Next, if the time t2b is reached, in the separation circuit 6a, the control signal $\Phi t1$ is set from the High level to the Low level, and the bit line BL and the local bit line LBL are separated from each other. The control signal $\Phi t2$ is kept at the High level, and the bit line /BL and the local bit line /LBL are connected to each other. In this case, it is not necessary to set the signal level of the control signal $\Phi t2$ to the Low level once.

Subsequently, it the time t3b is reached (after the amplification operation of the PMOS sense circuit 2), in the separation circuit 6a, the control signal $\Phi t1$ is set from the Low level to the HH level, and the bit line BL and the local bit line LBL are connected to each other. When the control signal $\Phi t2$ is set from the High level to the HH level, and the bit line /BL and the local bit line /LBL are connected to each other. The subsequent operation is the same as the first embodiment, and thus a description thereof will be omitted.

As described above, the semiconductor memory apparatus of this embodiment is provided with the PMOS sense circuit 1, the NMOS sense circuit 2, the precharge circuit 3, the dummy cell circuit 4, the column selection circuit 5, the separation circuit 6a, the memory cell array MCA1, the memory cell array MCA2, and the Nch MOS transistors NT3 and NT6. The separation circuit 6a is provided between the PMOS sense circuit 1 and the NMOS sense circuit 2. The Nch MOS transistor NT1 connects or separates the bit line BL and the local bit line LBL to or from each other on the basis of the control signal $\Phi t1$, and the Nch MOS transistor NT2 connects or separates the bit line /BL and the local bit line /LBL to or from each other on the basis of the control signal $\Phi t2$.

For this reason, in addition to the effects of the first embodiment, connection or separation between the bit line BL and the local bit line LBL, and connection or separation between the bit line /BL and the local bit line /LBL can be separately performed by using the separation circuit 6a, and an unnecessary circuit operation can be eliminated. Therefore, power consumption of the semiconductor memory apparatus 52 can be suppressed.

Fourth Embodiment

Figure 14:
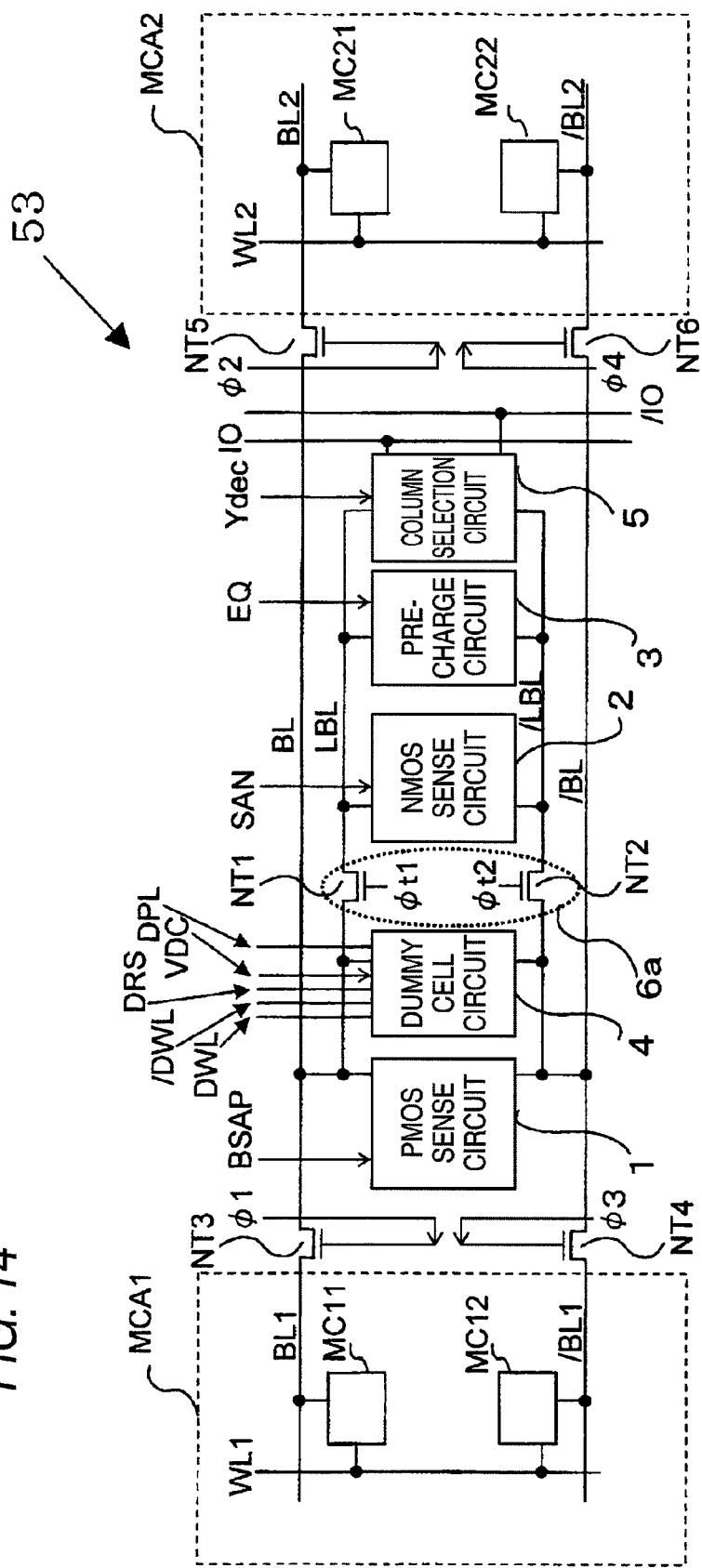
FIG. 14 is a circuit diagram showing a semiconductor memory apparatus according to a fourth embodiment of the invention.

Next, a semiconductor memory apparatus according to a fourth embodiment of the invention will be described with reference to the drawings. FIG. 14 is a circuit diagram showing a semiconductor memory apparatus. In this embodiment, a sense amplifier is divided into a PMOS sense circuit and an NMOS sense circuit. An NMOS sense circuit, a precharge circuit, and a column selection circuit are connected to local bit lines, and two transistors forming a separation circuit are separately controlled.

As shown in FIG. 14, a semiconductor memory apparatus 53 is provided with a PMOS sense circuit 1, an NMOS sense circuit 2, a precharge circuit 3, a dummy cell circuit 4, a column selection circuit 5, a separation circuit 6a, a memory cell array MCA1, a memory cell array MCA2, and Nch MOS transistors NT3 to NT6. The semiconductor memory apparatus 53 is a DRAM that has a folded bit line structure, in which a bit line BL and a bit line /BL are arranged so as to be opposite each other, and uses a dummy cell reference scheme.

The separation circuit 6a serving as a switch unit is provided between the dummy cell circuit 4 and the NMOS sense circuit 2, and has Nch MOS transistors NT1 to NT2.

The Nch MOS transistor NT1 connects or separates the bit line BL and the local bit line LBL to or from each other on the basis of the control signal $\Phi t1$. When the control signal $\Phi t1$ is at the High level, the bit line BL and the local bit line LBL are connected to each other. When the control signal $\Phi t1$ is at the Low level, the bit line BL and the local bit line LBL are separated from each other.

The Nch MOS transistor NT2 connects or separates the bit line /BL and the local bit line /LBL to or from each other on the basis of the control signal Φt2. When the control signal Φt2 is at the High level, the bit line /BL and the local bit line /LBL are connected to each other. When the control signal Φt2 is at the Low level, the bit line /BL and the local bit line /LBL are separated from each other. The structure other than the separation circuit 6a is the same as the second embodiment (the circuit structure is also the same), and thus a description thereof will be omitted.

Figure 15:
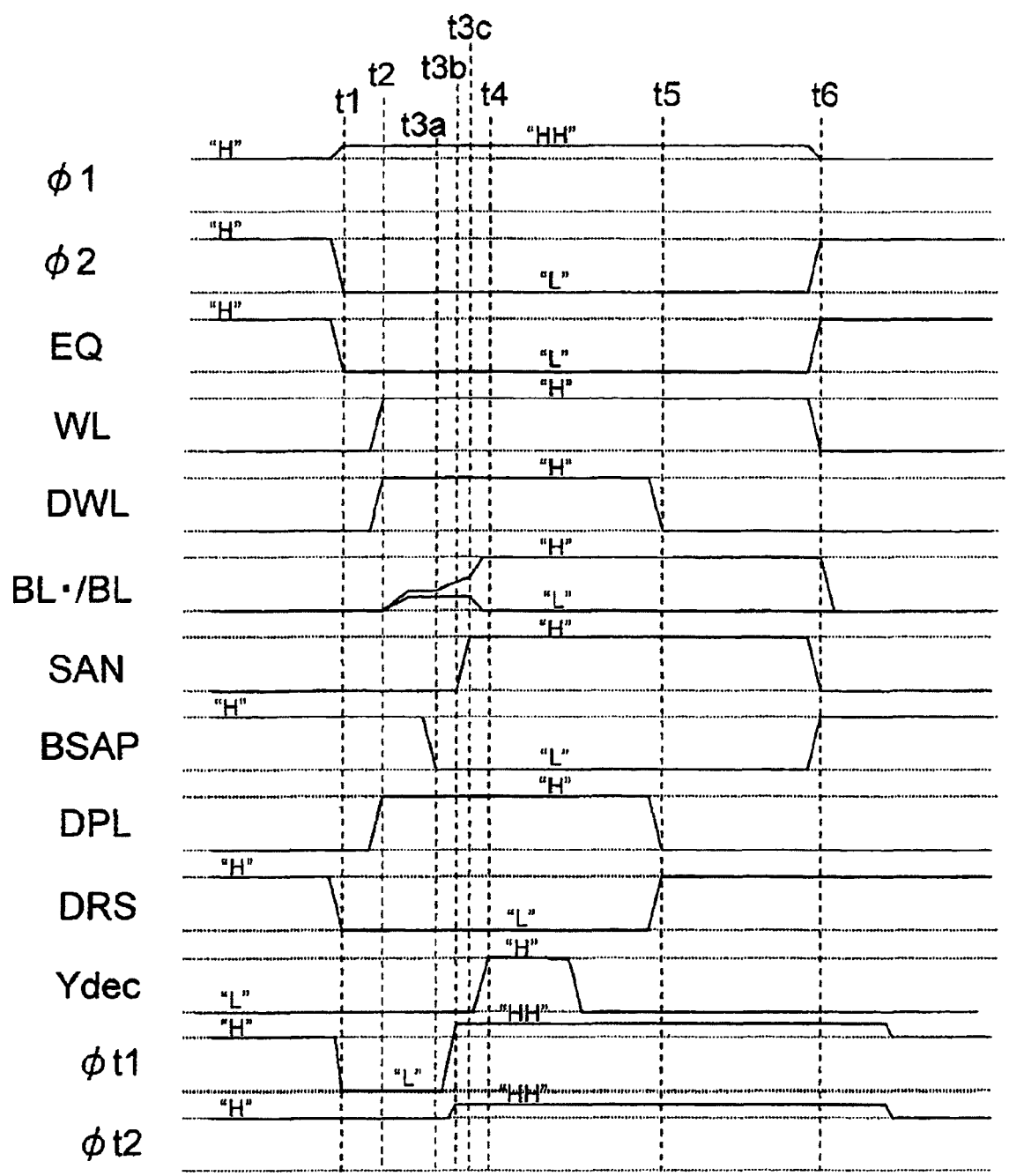
FIG. 15 is a timing chart showing a read-out operation of the semiconductor memory apparatus according to the fourth embodiment.

Next, the operation of the semiconductor memory apparatus will be described with reference to FIG. 15. FIG. 15 is a timing chart showing a read-out operation of a semiconductor memory apparatus. In this case, the read-out operation when the memory cell MC11 is selected will be described. The operation other than the separation circuit 6a is the same as the second embodiment, and thus only a difference will be described.

As shown in FIG. 15, in the semiconductor memory apparatus 53, at the time of precharging before reading-out of information stored in the memory cell MC11, during a period till the time t1, the control signals Φt1 and Φt2 are at the High level.

Next, if the time t1 is reached at which the read-out operation of the semiconductor memory apparatus 53 starts, the control signal Φt1 is set from the High level to the Low level. As a result, the bit line BL and the local bit line LBL are separated from each other.

Next, if the time t3b is reached (after the amplification operation of the PMOS sense circuit 2), in the separation circuit 6a, the control signal Φt1 is set from the Low level to the HH level, and the bit line BL and the local bit line LBL are connected to each other. The control signal Φt2 is set from the High level to the HH level. The subsequent operation is the same as the second embodiment, and thus a description will be omitted.

As described above, the semiconductor memory apparatus of this embodiment is provided with the PMOS sense circuit 1, the NMOS sense circuit 2, the precharge circuit 3, the dummy cell circuit 4, the column selection circuit 5, the separation circuit 6a, the memory cell array MCA1, the memory cell array MCA2, and the Nch MOS transistors NT3 to NT6. The separation circuit 6a is provided between the dummy cell circuit 4 and the NMOS sense circuit 2. The Nch MOS transistor NT1 connects or separates the bit line BL and the local bit line LBL to or from each other on the basis of the control signal Φt1, and the Nch MOS transistor NT2 connects or separates the bit line /BL and the local bit line /LBL to or from each other on the basis of the control signal Φt2.

For this reason, in addition to the effects of the first and second embodiments, connection or separation between the bit line BL and the local bit line LBL, and connection or separation between the bit line /BL and the local bit line /LBL can be performed by using the separation circuit 6a, and an unnecessary circuit operation can be eliminated. Therefore, power consumption of the semiconductor memory apparatus 53 can be suppressed.

The invention is not limited to the foregoing embodiments, and various changes or modifications may be made without departing from the spirit of the invention.

For example, in the embodiments, the semiconductor memory apparatus has a folded bit line structure (the cell size is about 8 $F^2$ (where F is a minimum processing size)). Alternatively, the cell size may be smaller than the folded bit line structure. For example, an open bit line structure, in which the cell size ranging from 4 to 6 $F^2$ is possible, may be used. In addition, the memory operation is performed by a dummy cell reference scheme using a dummy cell circuit, but the invention may be applied to the case where no dummy cell circuit is used.

The invention may be implemented as described in the following additional remarks.

(Additional Remark 1) A semiconductor memory apparatus includes a memory cell array having memory cells arranged in a matrix, to which a first bit line and a word line are connected, a first sense circuit connected to a second bit line so as to amplify information read out from the memory cells, a first switch unit provided between the memory cell array and the first sense circuit so as to connect or separate the first bit line and the second bit line to or from each other, a precharge circuit connected to the second bit line, a second sense circuit connected to local bit lines so as to amplify information of the memory cells amplified by the first sense circuit to a high level or a low level and to output an amplified signal, a second switch unit provided between the precharge circuit and the second sense circuit so as to separate the local bit lines from the second bit line at the time of the amplification operation of the first sense circuit and to connect the second bit line and the local bit lines to each other at the time of the amplification operation of the second sense circuit, and a column selection circuit connected to the local bit lines.

(Additional Remark 2) In the semiconductor memory apparatus described in the additional remark 1, a dummy cell circuit is connected to the local bit lines.

(Additional Remark 3) In the semiconductor memory apparatus described in the additional remark 1 or 2, the first and second switch units are Nch insulated gate field effect transistors that are turned on when a signal at a high level is input to the gate thereof.

What is claimed is:

1. A semiconductor memory apparatus comprising:
   a upper bit line;
   a lower bit line;
   an upper local bit line;
   a lower local bit line;
   a first switch between the upper bit line and the upper local bit line, configured to control a connection between the upper bit line and the upper local bit line;
   a second switch between the lower bit line and the lower local bit line, configured to control a connection between the lower bit line and the lower local bit line;
   a first memory cell array comprising:
     a first memory cell connected to a first upper bit line and a first word line; and
     a second memory cell connected to a first lower bit line and the first word line;
   a second memory cell array comprising:
     a third memory cell connected to a second upper bit line and a second word line; and
     a fourth memory cell connected to a second lower bit line and
   the second word line;
   a first sense circuit connected to the upper and lower bit lines and configured to amplify a signal from the first to fourth memory cells;
   a third switch between the first upper bit line and the upper bit line, configured to control a connection between the first memory cell and the first sense circuit;
   a fourth switch between the first lower bit line and the lower bit line, configured to control a connection between the second memory cell and the first sense circuit;
   a fifth switch between the second upper bit line and the upper bit line, configured to control a connection between the third memory cell and the first sense circuit;

a sixth switch between the second lower bit line and the lower bit line, configured to control a connection between the fourth memory cell and the first sense circuit;

a second sense circuit connected to the upper and lower local bit lines and configured to amplify the signal amplified by the first sense circuit; and a dummy cell circuit connected to the upper and lower local bit lines, wherein the first switch disconnects the upper local bit line from the upper bit line while the second switch disconnects the lower local bit line from the lower bit line, when the first sense circuit amplifies the signal; and the first switch connects the upper local bit line to the upper bit line while the second switch connects the lower local bit line to the lower bit line, when the second sense circuit amplifies the signal amplified by the first sense circuit.

2. The apparatus of claim 1 further comprising:
a precharge circuit connected to the upper and lower local bit line; and
a column selection circuit connected to the upper and lower local bit line.

3. The apparatus of claim 1, wherein the dummy cell circuit is connected to the upper bit line between the first sense circuit and the first switch.

4. The apparatus of claim 1, wherein the first sense circuit comprises a P channel (Pch) insulated gate field effect transistor, and the second sense circuit comprises an N channel (Nch) insulated gate field effect transistor.

5. The semiconductor memory apparatus of claim 1, wherein the semiconductor memory apparatus is DRAM.

6. The semiconductor memory apparatus of claim 1, wherein the semiconductor memory apparatus is FeRAM.

7. The semiconductor memory apparatus of claim 1, wherein the fifth switch is configured to disconnect the second upper bit line and the upper bit line when the third switch connects the first upper bit line and the upper bit line.

8. The apparatus of claim 7 further comprising:
a precharge circuit connected to the upper and lower local bit line; and
a column selection circuit connected to the upper and lower local bit line.

9. The apparatus of claim 7, wherein the dummy cell circuit is connected to the upper bit line between the first sense circuit and the first switch.

10. The apparatus of claim 7, wherein the first sense circuit comprises a P channel (Pch) insulated gate field effect transistor, and the second sense circuit comprises an N channel (Nch) insulated gate field effect transistor.

11. The semiconductor memory apparatus of claim 7, wherein the semiconductor memory apparatus is DRAM.

12. The semiconductor memory apparatus of claim 7, wherein the semiconductor memory apparatus is FeRAM.

* * * * *